(12) United States Patent
Storm et al.

(10) Patent No.: US 8,024,936 B2
(45) Date of Patent: Sep. 27, 2011

(54) COOLING APPARATUS, SYSTEMS, AND METHODS

(75) Inventors: Bruce H Storm, Houston, TX (US);
Dingding Chen, Plano, TX (US);
Haoshi Song, Sugar Land, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 407 days.

(21) Appl. No.: 10/990,075

(22) Filed: Nov. 16, 2004

(65) Prior Publication Data
US 2006/0101831 A1    May 18, 2006

(51) Int. Cl.
*F25B 21/02* (2006.01)
(52) U.S. Cl. .............. 62/3.7; 62/3.2; 62/3.61; 62/259.2; 165/32; 165/180
(58) Field of Classification Search .............. 62/3.2, 62/3.61, 3.7, 259.2; 165/32, 180
See application file for complete search history.

(56) References Cited

U.S. PATENT DOCUMENTS

| | | | |
|---|---|---|---|
| 4,134,462 A | 1/1979 | Clay | |
| 4,164,253 A | 8/1979 | Skala | |
| 4,375,157 A | 3/1983 | Boesen | |
| 4,400,858 A * | 8/1983 | Goiffon et al. | 24/546 |
| 4,403,645 A | 9/1983 | MacCracken | |
| 4,407,136 A | 10/1983 | de Kanter | |
| 4,416,000 A | 11/1983 | Scherbatskoy | |
| 4,449,164 A | 5/1984 | Carlson et al. | |
| 4,513,352 A | 4/1985 | Bennett et al. | |
| 4,547,833 A | 10/1985 | Sharp | |
| 4,987,684 A | 1/1991 | Andreas et al. | |
| 5,159,972 A * | 11/1992 | Gunnerson et al. | 165/274 |
| 5,165,243 A | 11/1992 | Bennett | |
| 5,456,081 A | 10/1995 | Chrysler et al. | |
| 5,458,200 A | 10/1995 | Lagerlef et al. | |
| 5,547,028 A | 8/1996 | Owens et al. | |
| 5,701,751 A | 12/1997 | Flores | |
| 5,713,208 A | 2/1998 | Chen et al. | |
| 5,720,342 A | 2/1998 | Owens et al. | |
| 5,727,618 A | 3/1998 | Mundinger et al. | |
| 5,737,923 A | 4/1998 | Gilley et al. | |

(Continued)

FOREIGN PATENT DOCUMENTS

DE        6606149        8/1970

(Continued)

OTHER PUBLICATIONS

"U.S. Appl. No. 11/292,943, Amendment and Response filed May 14, 2008 to Non Final Office Action mailed Nov. 14, 2007", 10 pgs.
"U.S. Appl. No. 11/293,868, Non-Final Office Action mailed Jun. 18, 2008", 5 pgs.
"U.S. Appl. No. 11/293,868, Response filed Apr. 4, 2008 to Restriction Requirement mailed Oct. 4, 2007", 8 pgs.
"U.S. Appl. No. 11/293,868, Restriction Requirement mailed Oct. 4, 2007", 5 pgs.

(Continued)

*Primary Examiner* — Frantz F Jules
*Assistant Examiner* — Azim Rahim
(74) *Attorney, Agent, or Firm* — Schwegman, Lundberg & Woessner, P.A.

(57) ABSTRACT

Apparatus and systems, as well as methods and articles, may operate to actively cool an electronic device using a first heat removing cooling element, and to induce a thermal gradient in a heat pipe by conducting heat from a hot side of the first heat removing cooling element to a cold side of a second heat removing cooling element using the heat pipe. The heat pipe may comprise a variable conductance heat pipe. The apparatus and system may operate in a downhole environment, including logging and drilling operations.

14 Claims, 5 Drawing Sheets

U.S. PATENT DOCUMENTS

| | | | |
|---|---|---|---|
| 5,771,984 A | 6/1998 | Potter et al. | |
| 5,901,037 A | 5/1999 | Hamilton et al. | |
| 5,934,082 A | 8/1999 | Steinmeyer | |
| 5,977,785 A | 11/1999 | Burward-Hoy | |
| 6,084,770 A | 7/2000 | Wyland | |
| 6,089,311 A | 7/2000 | Edelson | |
| 6,094,919 A * | 8/2000 | Bhatia | 62/3.7 |
| 6,178,088 B1 | 1/2001 | Gates | |
| 6,200,536 B1 | 3/2001 | Tonkovich et al. | |
| 6,201,221 B1 | 3/2001 | LaGrotta et al. | |
| 6,341,498 B1 * | 1/2002 | DiFoggio | 62/259.2 |
| 6,411,512 B1 | 6/2002 | Mankaruse et al. | |
| 6,415,612 B1 | 7/2002 | Pokharna et al. | |
| 6,432,497 B2 | 8/2002 | Bunyan | |
| 6,481,216 B2 | 11/2002 | Simmons et al. | |
| 6,501,654 B2 | 12/2002 | O'Connor et al. | |
| 6,519,955 B2 | 2/2003 | Marsala | |
| 6,539,725 B2 * | 4/2003 | Bell | 62/3.7 |
| 6,557,354 B1 | 5/2003 | Chu et al. | |
| 6,590,770 B1 | 7/2003 | Rogers et al. | |
| 6,644,395 B1 | 11/2003 | Bergin | |
| 6,687,126 B2 | 2/2004 | Patel et al. | |
| 6,766,817 B2 | 7/2004 | da Silva | |
| 6,769,487 B2 | 8/2004 | Hache | |
| 6,799,429 B2 | 10/2004 | Drube et al. | |
| 6,834,671 B2 | 12/2004 | Cotte et al. | |
| 6,837,105 B1 | 1/2005 | DiFoggio et al. | |
| 6,864,417 B2 | 3/2005 | Bechis et al. | |
| 7,258,169 B2 | 8/2007 | Fripp et al. | |
| 7,342,787 B1 * | 3/2008 | Bhatia | 361/700 |
| 7,423,876 B2 * | 9/2008 | Artman et al. | 361/700 |
| 7,699,102 B2 | 4/2010 | Storm et al. | |
| 7,717,167 B2 | 5/2010 | Storm et al. | |
| 2002/0033247 A1 | 3/2002 | Neuschutz et al. | |
| 2002/0039280 A1 | 4/2002 | O'Connor et al. | |
| 2002/0062648 A1 | 5/2002 | Ghoshal | |
| 2002/0144811 A1 | 10/2002 | Chou et al. | |
| 2002/0159237 A1 | 10/2002 | Patel et al. | |
| 2002/0186531 A1 * | 12/2002 | Pokharna et al. | 361/687 |
| 2003/0061824 A1 | 4/2003 | Marsala | |
| 2003/0085039 A1 | 5/2003 | DiFoggio | |
| 2003/0089486 A1 | 5/2003 | Parish et al. | |
| 2003/0097846 A1 * | 5/2003 | Novotny et al. | 62/3.7 |
| 2003/0116302 A1 | 6/2003 | Sauciuc et al. | |
| 2003/0136548 A1 | 7/2003 | Parish et al. | |
| 2003/0140636 A1 * | 7/2003 | Van Winkle | 62/3.61 |
| 2003/0151523 A1 | 8/2003 | Skinner et al. | |
| 2003/0152764 A1 | 8/2003 | Bunyan et al. | |
| 2003/0178177 A1 | 9/2003 | Eytcheson et al. | |
| 2003/0178178 A1 | 9/2003 | Breuer et al. | |
| 2003/0183375 A1 | 10/2003 | Clarksean | |
| 2003/0186531 A1 | 10/2003 | Allman et al. | |
| 2004/0042176 A1 | 3/2004 | Niwatsukino et al. | |
| 2004/0079100 A1 | 4/2004 | Monfarad | |
| 2004/0237529 A1 | 12/2004 | da Silva | |
| 2005/0022404 A1 | 2/2005 | Ash et al. | |
| 2006/0101831 A1 | 5/2006 | Storm et al. | |
| 2006/0191681 A1 | 8/2006 | Storm et al. | |
| 2006/0191682 A1 | 8/2006 | Storm et al. | |
| 2006/0191687 A1 | 8/2006 | Storm et al. | |
| 2010/0132934 A1 | 6/2010 | Storm et al. | |

FOREIGN PATENT DOCUMENTS

| | | |
|---|---|---|
| DE | 3735985 | 5/1988 |
| DE | 3825981 | 2/1990 |
| DE | 19533555 | 3/1997 |
| DE | 19901445 | 8/2000 |
| DE | 69802659 T2 | 8/2002 |
| DE | 10205223 | 8/2003 |
| DE | 202004003783 U1 | 5/2004 |
| GB | 1563091 | 3/1980 |
| GB | 2197538 | 5/1988 |
| WO | WO-2006055467 A1 | 5/2006 |

OTHER PUBLICATIONS

"Germany Patent Application No. 112005002780.5-34, Office Action mailed Jun. 27, 2008", (w/ English Translation), 19 pgs.

"United Kingdom Application Serial No. 0711767.4, Office Action mailed Feb. 27, 2008", 11 pgs.

Steinberg, D. S., *Cooling Techniques for Electronic Equipment*, Second Edition, John Wiley & Sons, Inc, (1991), 363-371.

"United Kingdom Application Serial No. 0711767.4, Response filed Aug. 27, 2008 to Examination Report mailed Feb. 27, 2008", 2 pgs.

"United Kingdom Application Serial No. 0711767.4 Examination Report mailed on Oct. 2, 2008", 21 pgs.

"U.S. Appl. No. 11/293,868, Response filed Dec. 18, 2008 to Non-Final Office Action mailed Jun. 18, 2008", 7 pgs.

0711767.4, "United Kingdom Application Serial No—0711767.4 office action mailed Feb. 9, 2009", 1.

200580038775.7, "China Application Serial No. 200580038775.7, office Action Mailed on Mar. 13, 2009", 10.

"U.S. Appl. No. 11/292,943, Non-Final Office Action mailed Jul. 6, 2009", 6 pgs.

"U.S. Appl. No. 11/292,943, Response filed Jun. 24, 2009 to Final Office Action mailed Dec. 24, 2008", 6 pgs.

"U.S. Appl. No. 11/293,868, Notice of Allowance mailed Apr. 23, 2009", 6 pgs.

"U.S. Appl. No. 11/293,868, Supplemental Notice of Allowability mailed Jun. 2, 2009", 4 pgs.

2005306642, "Australian Application No. 2005306642 Office Action Mailed Apr. 14, 2009", 2.

"U.S. Appl. No. 11/293,041, Non Final Office Action mailed Jul. 27, 2009", 5 pgs.

"United Kingdom Application Serial No. 0711767.4, Response filed Jan. 7, 2009 to Examination Report dated Dec. 11, 2008", 9 pgs.

"United Kingdom Application Serial No. 0711767.4, Response filed Mar. 16, 2009 to Examination Report mailed Feb. 9, 2009", 2 pgs.

"Developed Micropump for water cooling system", http://www.skcj.co.jp/english/motor/micropumpe.html, (Archived Nov. 3, 2004), 2 Pages.

"Heretic Program Overview", http://www.darpa.mil/MTO/HERETIC/overview.html *Defense Advanced Research Projects Agency (Darpa)*, (Observed Sep. 3, 2002), 3 Pages.

"International Search Report and Written Opinion for Application No. PCT/US2005/041105, date mailed May 3, 2006", 10 pages.

"Micro Annular Gear Pumps", http://www.micropump.com/products/pumps/micro_annular/index.asp, *IDEX Corporation*, (Archived Aug. 18, 2003), 2 Pages.

"Micro Pumps", http://www.directindustry.com/search/micro%20pumps.html, (Observed Jan. 18, 2005), 3 Pages.

"Pumps", *APT Micro and Dispensing Pumps*, http://www.iprocessmart.com/apt/pumps.htm, (Archived Oct. 17, 2001), 3 Pages.

"Single Phase Micro-Fluid Loop for Cooling of Microelectronic Devices", http://www.me.gatech.edu/yogendra.joshi/METTL/projects/current/wei/single_phase_micro.htm, Georgia Tech University, (Archived Jul. 13, 2002), 3 Pages.

"Smart Thermal Management Systems Based on Solid Liquid Phase Change Materials", http://www.me.gatech.edu/yogendra.joshi/METTL/projects/current/dong/dong.htm, (Archived Jul. 13, 2002), 3 Pages.

"Ultra-Low Flow Pump utilizes external gear technology", *News Story*, http://news.thomasnet.com/fullstory/451530, 2 Pages.

"Ultrasonic Driven Minipump", *Microsystems*, http://www.europractice.com/technologies/microsystems/products/product_detail.asp?ID=17, (Archived Jan. 14, 2003), 2 Pages.

Gonzalez, Ulises F., et al., "Simulation of Mems Piezoelectric Micropump for Biomedical Applications", http://www.algor.com/news_pubs/tech_white_papers/MEMS_micropump/default.asp?print...., (Observed Jan. 18, 2005), 1-13

Meng, Ellis, et al., "Polymer MEMS for Micro Fluid Delivery Systems", *Department of Electrical Engineering California Institute of Technology*, 2 Pages.

Zhang, Lian, "Measurements and Modeling of two-phase flow in microchannels with nearly constant heat flux boundary conditions", *Journal of Microelectromechanical Systems*, 11(1), (Feb. 2002), 12-19.

* cited by examiner

COOLING APPARATUS, SYSTEMS, AND METHODS

TECHNICAL FIELD

Various embodiments described herein relate to cooling generally, including apparatus, systems, and methods used to cool electronic devices.

BACKGROUND INFORMATION

Heat storing and heat removing cooling mechanisms have been developed to manage the thermal conditions surrounding thermal components, including electronic devices operating in high temperature locations, such as downhole environments, where temperatures typically reach about 200 C. While heat storing cooling can be effective for a short time, many designers resort to heat removing cooling strategies when extended operating times at high temperatures are anticipated.

Several problems may arise when heat removing cooling elements are used in the downhole environment. For example, single stage elements may be unable to maintain large temperature gradients. Multi-stage elements may not be commercially available. Even if multi-stage elements are used, the heat absorbed by the element (as well as operational heat) may be rejected close to the point of absorption, resulting in convective heat flow back to the object being cooled. For a variety of reasons, then, there is a need to provide improved thermal management solutions for operating electronic devices in downhole environments.

DETAILED DESCRIPTION

In some embodiments, the cold side of a first heat removing cooling element, such as a thermoelectric cooler (TEC), may be thermally coupled to a thermal component, such as a heat sensitive component, including an electronic device. A thermal gradient may then be induced in a thermal conduit, such as a heat pipe. This may be accomplished by thermally coupling the cold side of the thermal conduit to the hot side of the first heat removing cooling element, and coupling the cold side of a second heat removing cooling element (which may also comprise a TEC) to the hot side of the thermal conduit. In this manner, heat is "pulled" out of the electronic device, rather than "pushed" into a reservoir or some other storage mechanism. In some embodiments, the hot side of the second heat removing cooling element may be thermally coupled to a primary heat sink, such as the exterior wall of a pressure housing, including the insulated, evacuated flasks used in downhole drilling and logging operations.

For the purposes of this document, a "heat storing cooling element" is one that absorbs and stores heat, rather than exhausting heat. A "heat removing cooling element" is one that operates to actively exhaust heat to the environment. In some embodiments, a heat removing cooling element may comprise an electrically-powered cooling device, such as a TEC.

Figure 1:
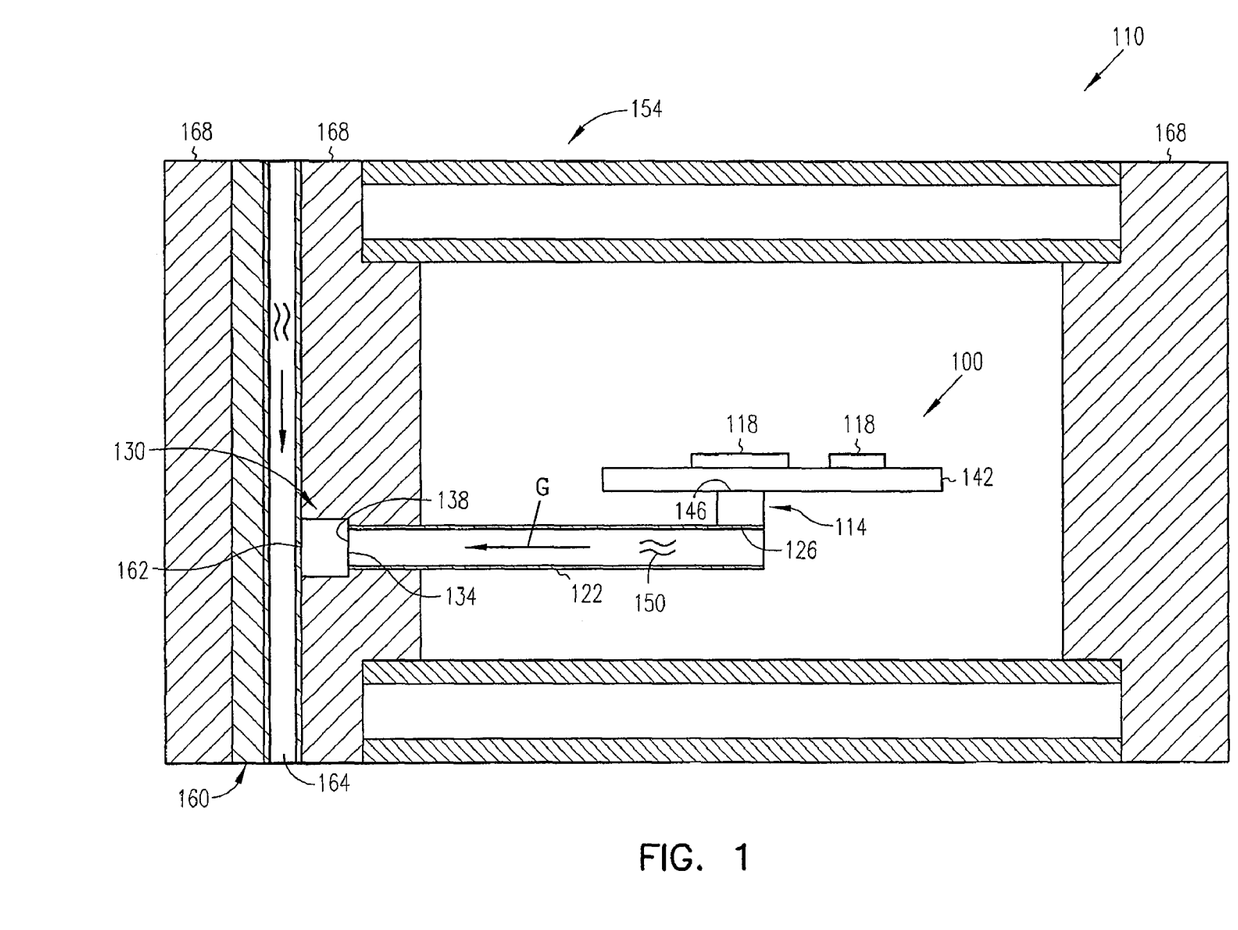
FIG. 1 illustrates an apparatus and system according to various embodiments of the invention.

FIG. 1 illustrates an apparatus 100 and system 110 according to various embodiments of the invention, each of which may operate in the manner described above. For example, and apparatus 100 may comprise a first heat removing cooling element 114 to thermally couple to one or more thermal components 118, including heat-sensitive components (e.g., electronic devices), and heat generating components (e.g., power supplies, transformers, connectors, and silicon-on-sapphire devices). The apparatus 100 may include a thermal conduit 122, such as a heat pipe, to be thermally coupled to a hot side 126 of the first heat removing cooling element 114. The apparatus 100 may also include a second heat removing cooling element 130 having a cold side 134 thermally coupled to a hot side 138 of the thermal conduit 122 to induce a thermal gradient G in the thermal conduit 122. In some embodiments, the apparatus 100 may include a thermal collector 142, such as a cold plate, disposed between the thermal components 118 and the cold side 146 of the first heat removing cooling element 114. In some embodiments, more than two heat removing cooling elements 114, 130 and more than one thermal conduit 122 may be used to form a cooling "chain" (e.g., a first (initial) cooling element may be coupled to the second cooling element with a first thermal conduit, and the second cooling element may be coupled to a third (ultimate) cooling element with a second thermal conduit).

The hot side of the second heat removing cooling element 130 (which may also comprise the ultimate cooling element in a chain) may be thermally coupled to one or more primary heat sink elements 160. The primary heat sink elements may comprise any man-made mechanism that is capable of thermal coupling to heat removal fluid in the surrounding environment, such as drilling mud and other fluids used in a borehole. Thus, for example, a primary heat sink may comprise a pressure housing, a logging tool housing, or portions and/or components thereof.

The first and second heat removing cooling elements 114, 130 may comprise any type of heat removing cooling elements. For example, either one or both of the heat removing cooling elements 114, 130 may be selected from a group including, but not limited to: thermoelectric cooling devices, thermionic cooling devices, thermal-acoustic cooling devices, and magnetic cooling devices. The thermal conduit 122 may also comprise a kind of heat removing cooling element, and if comprising a heat pipe, may be subdivided into at least two general types: fixed conductance heat pipes and variable conductance heat pipes.

The fixed conductance heat pipe is not generally restricted to a fixed operating temperature; its temperature may vary according to heat loading and sink conditions. However, there is no inherent temperature control capability. The pipe may be solid or hollow, and may be filed with a vaporizable fluid (e.g., a vapor phase heat pipe). Thermal conductance may be greater than about 50 Btu/(h·ft$^2$·°F.·ft), remaining substantially constant. Fixed conductance heat pipes may transfer heat in either direction, operate over broad temperature ranges, and comprise a type of heat removing cooling element that is non-powered.

With modification, the fixed conductance heat pipe can be made to incorporate variable conductance features and diode functions to maintain heat source temperatures at a constant level while the heat input increases up to 200 percent or more. Thus, a variable conductance heat pipe (VCHP) differs from other heat pipe types by its thermal control capability: the ability to keep the temperature of a device thermally coupled to the associated evaporator almost constant, substantially independent of changes to VCHP boundary conditions. For example, a gas-buffered VCHP, known to those of skill in the art, may include a cold reservoir (with or without a capillary wick) and a hot reservoir. Passive feedback control may be implemented using a bellows reservoir. Active (electrical) feedback control may also be used. Diode heat pipes permit heat to flow in one direction and inhibit heat flow in the opposite direction.

Thus, the thermal conduit 122 may comprise a substantially fixed conductance heat pipe or a variable conductance heat pipe. The thermal conduit 122 may have a hollow interior portion and include a vaporizable fluid 150. In many embodiments, the thermal conduit 122 may have a thermal conductivity of greater than about 50 Btu/(h·ft2·°F.·ft). Other embodiments may be realized.

For example, a system 110 may include an apparatus similar to or identical to the apparatus 100 described above, as well as a pressure housing 154. The pressure housing 154 may include one or more primary heat sink elements 160 to thermally couple to the hot side 162 of the second heat removing cooling element 130. The pressure housing 154 may comprise an insulating flask, including a substantially evacuated insulating flask.

In some embodiments, the primary heat sink elements 160, 260 (see FIG. 2) may comprise a second thermal conduit 164, 264 (see FIG. 2) including a second heat pipe. Thus, the system 110 may include one or more stoppers 168 mechanically coupled to the pressure housing 154 (e.g., an insulating flask), wherein the stoppers 168 include one or more thermal conduits 164 coupled to a hot side 162 of the second heat removing cooling element 130.

Figure 2:
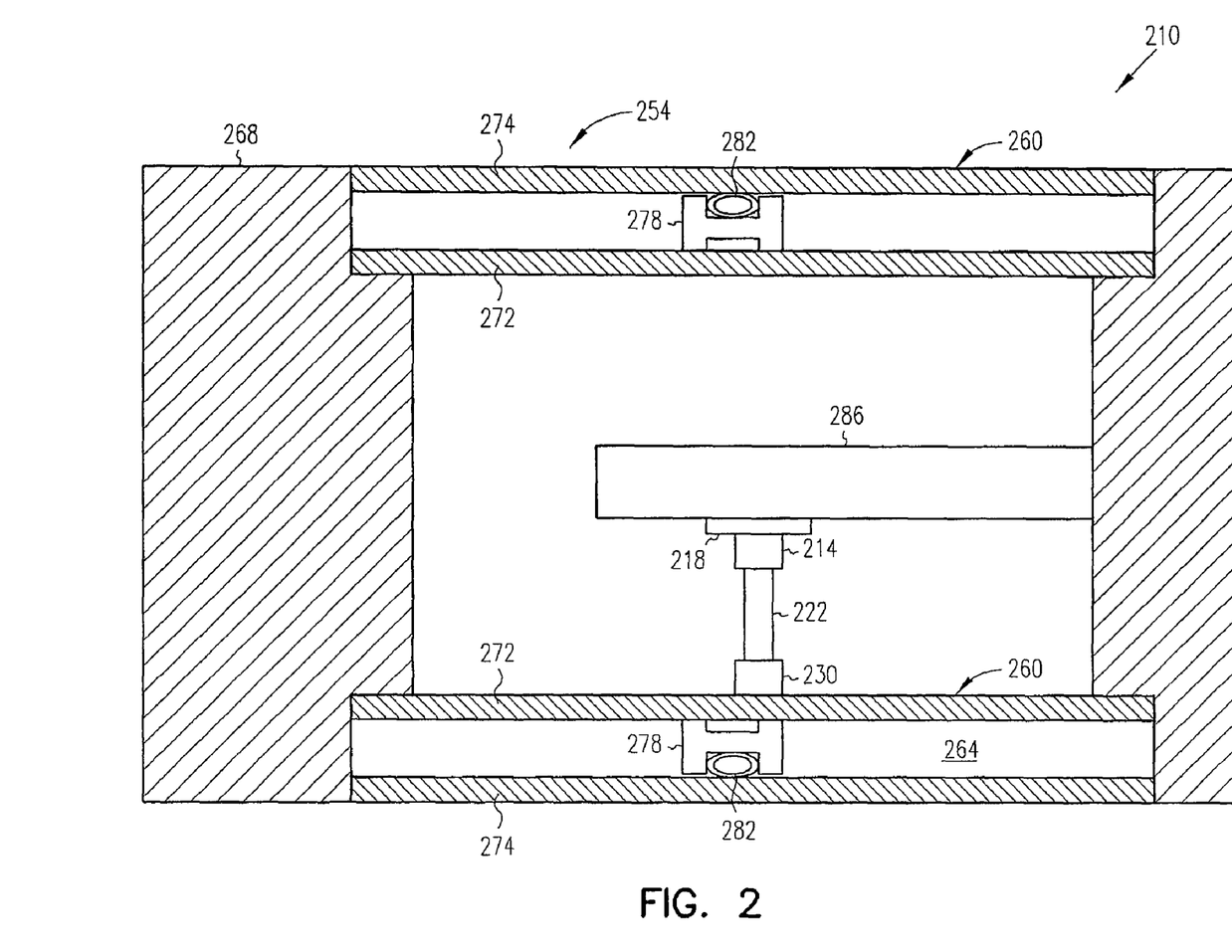
FIG. 2 illustrates another apparatus and system according to various embodiments of the invention.

FIG. 2 illustrates another apparatus 200 and system 210 according to various embodiments of the invention. The apparatus 200 and system 210 shown in FIG. 2 may be similar to or identical to the apparatus 100 and system 110, respectively, shown in FIG. 1. In FIG. 2 it can be seen that in some embodiments, the primary heat sink elements 260 may comprise an interior wall 272 or an exterior wall 274 of the pressure housing 254 having stoppers 268, or both. The interior wall 272 and the exterior wall 274 may be separated by a support 278 and/or an O-ring 282. In the illustrated embodiment, thermal components 218 (e.g., an electronic device attached to a circuit board 286) may be directly thermally coupled to the first heat removing cooling element 214. The thermal conduit 222, which may comprise one or more heat pipes, may be directly thermally coupled to the first heat removing cooling element 214 and the second heat removing cooling element 230. The second heat removing cooling element 230, in turn, may be thermally coupled to various primary heat sink elements 260, including the interior wall 272 of the pressure housing 254.

Figure 3:
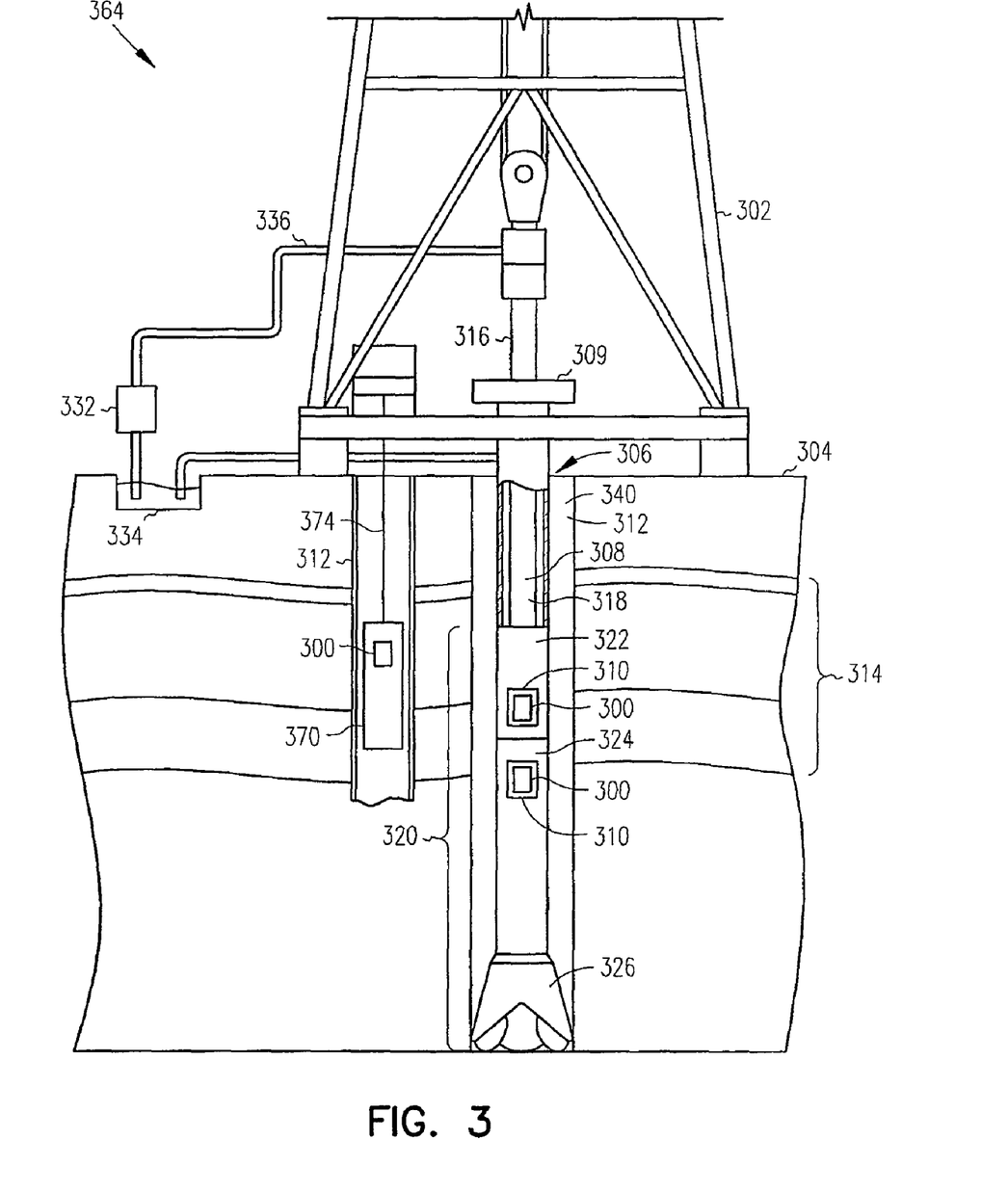
FIG. 3 illustrates several systems according to various embodiments of the invention.

FIG. 3 illustrates several systems 364 according to various embodiments of the invention, which may comprise portions of a bottom hole assembly 320 as part of a downhole drilling operation. Such systems 364 may be used in drilling and logging operations.

In some embodiments, a system 364 may form a portion of a drilling rig 302 located at the surface 304 of a well 306. The drilling rig 302 may provide support for a drill string 308. The drill string 308 may operate to penetrate a rotary table 309 for drilling a bore hole 312 through subsurface formations 314. The drill string 308 may include a Kelly 316, a drill pipe 318, and a bottom hole assembly 320, perhaps located at the lower portion of the drill pipe 318.

The bottom hole assembly 320 may include drill collars 322, perhaps coupled to a downhole tool 324 and/or a drill bit 326. The drill bit 326 may operate to create a borehole 312 by penetrating the surface 304 and subsurface formations 314. The downhole tool 324 may comprise any of a number of different types of tools including MWD (measurement while drilling) tools, LWD (logging while drilling) tools, and others.

During drilling operations, the drill string 308 (perhaps including the Kelly 316, the drill pipe 318, and the bottom hole assembly 320) may be rotated by the rotary table 309. In addition to, or alternatively, the bottom hole assembly 320 may also be rotated by a motor (e.g., a mud motor) that is located downhole. The drill collars 322 may be used to add weight to the drill bit 326. The drill collars 322 also may stiffen the bottom hole assembly 320 to allow the bottom hole assembly 320 to transfer the added weight to the drill bit 326, and in turn, assist the drill bit 326 in penetrating the surface 304 and subsurface formations 314.

During drilling operations, a mud pump 332 may pump drilling fluid (sometimes known by those of skill in the art as "drilling mud") from a mud pit 334 through a hose 336 into the drill pipe 318 and down to the drill bit 326. The drilling fluid can flow out from the drill bit 326 and be returned to the surface 304 through an annular area 340 between the drill pipe 318 and the sides of the bore hole 312. The drilling fluid may then be returned to the mud pit 334, where such fluid is filtered. In some embodiments, the drilling fluid can be used to cool the drill bit 326, as well as to provide lubrication for the drill bit 326 during drilling operations. Additionally, the drilling fluid may be used to remove subsurface formation 314 cuttings created by operating the drill bit 326.

Thus, it may be seen that in some embodiments the system 364 may include a bottom hole assembly 320, one or more apparatus 300, similar to or identical to the apparatus 100, 200 described above and illustrated in FIGS. 1 and 2, and/or one or more sub-systems 310 (which may in turn be similar to or identical to the systems 110, 210 described previously with respect to FIGS. 1 and 2). Thus, in some embodiments, the system 364 may include a collar 322 to couple to a drill bit 326 and to house one or more pressure housings (e.g., insulating flasks), similar to or identical to the pressure housings 154, 254 included in the systems 110, 210, respectively, and shown in FIGS. 1 and 2.

In some embodiments (e.g., wireline applications), a system 364 may include a tool body 370 to couple to a logging cable 374. The tool body 370 may house one or more pressure housings, similar to or identical to the pressure housings 154, 254 included in the systems 110, 210, respectively, and shown in FIGS. 1 and 2. The logging cable 374 may comprise a wireline (multiple power and communication lines), a monocable (a single conductor), and/or a slick-line (no conductors for power or communications).

The apparatus 100, 200, systems 110, 210, 364, heat removing cooling elements 114, 130, 214, 230, thermal components 118, 218, thermal conduits 122, 164, 222, hot sides 126, 138, 162, thermal collector 142, cold side 146, vaporizable fluid 150, pressure housings 154, 254, primary heat sink elements 160, 260, stoppers 168, interior wall 272, exterior wall 274, support 278, O-ring 282, circuit board 286, drilling rig 302, surface 304, well 306, drill string 308, rotary table 309, sub-systems 310, borehole 312, subsurface formations 314, Kelly 316, drill pipe 318, bottom hole assembly 320, drill collars 322, downhole tool 324, drill bit 326, mud pump 332, mud pit 334, annular area 340, tool body 370, logging cable 374, and thermal gradient G may all be characterized as "modules" herein. Such modules may include hardware circuitry, and/or one or more processors and/or memory circuits, software program modules, including objects and collections of objects, and/or firmware, and combinations thereof, as desired by the architect of the apparatus 100, 200, 300, sub-systems 310, and systems 110, 210, and 364, and as appropriate for particular implementations of various embodiments of the invention. For example, such modules may be included in a system operation software simulation package, such as an electrical signal simulation package, a power usage and distribution simulation package, a power/heat dissipation simulation package, a signal transmission-reception simulation package, and/or a combination of software and hardware used to simulate the operation of various potential embodiments.

It should also be understood that the apparatus and systems of various embodiments can be used in applications other than for logging, drilling, and downhole operations, and thus, various embodiments are not to be so limited. The illustrations of apparatus 100, 200, 300, sub-systems 310, and systems 110, 210, and 364 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules, including multilayer, multi-chip modules. Such apparatus and systems may further be included as sub-components within a variety of electronic systems, such as televisions, cellular telephones, personal computers, spaceflight computers, personal digital assistants (PDAs), workstations, radios, video players, vehicles, and others. Still other embodiments may be realized, as shown in FIG. 4.

Figure 4:
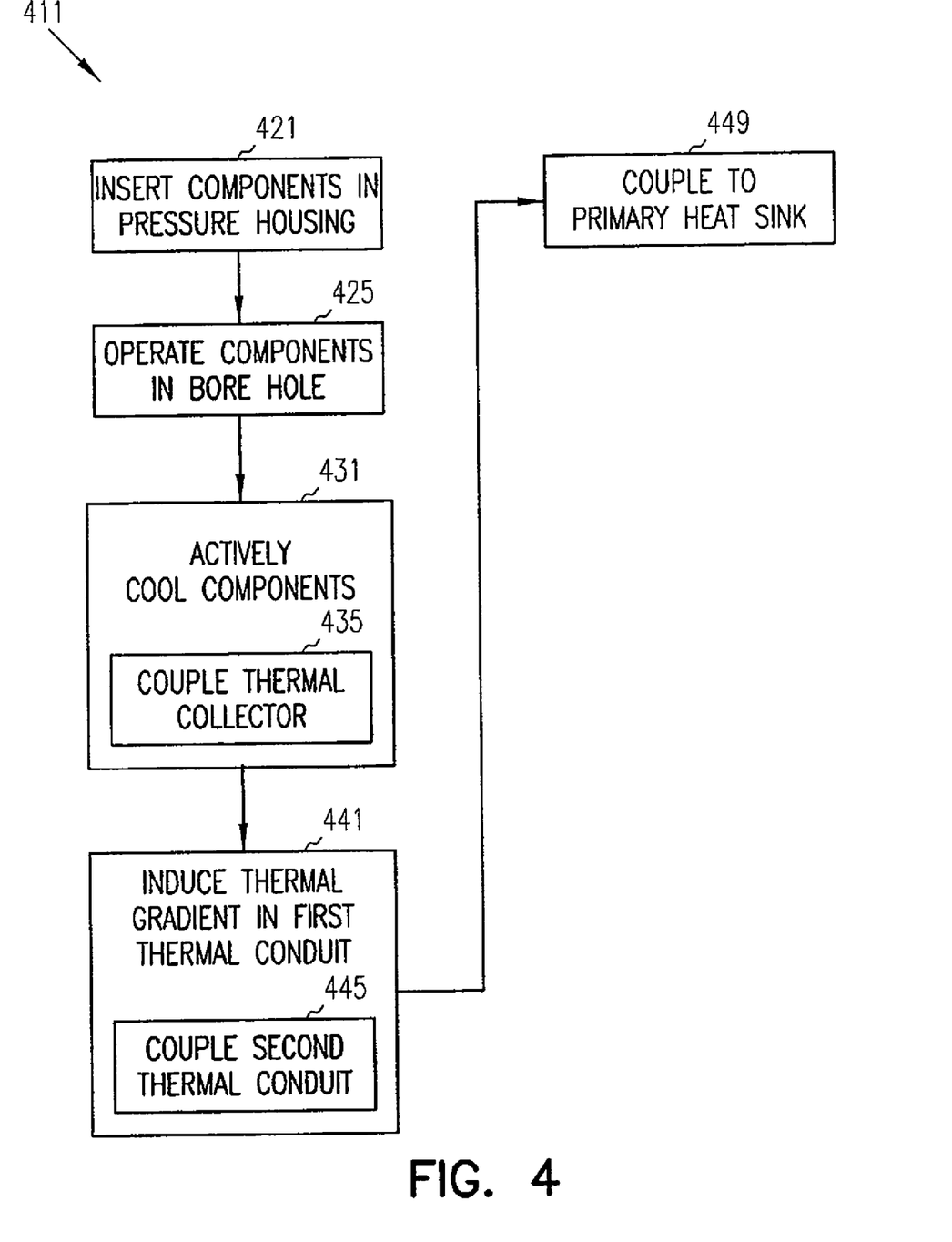
FIG. 4 is a flow diagram illustrating several methods according to various embodiments of the invention.

FIG. 4 is a flow diagram illustrating several methods according to various embodiments of the invention. Thus, in some embodiments, a method 411 may (optionally) begin with inserting one or more thermal components, such as heat sensitive components or heat generating components, into a pressure housing at block 421. As noted previously, the pressure housing may comprise an insulated flask, such as a substantially evacuated insulating flask, of the type used in downhole operations. Thus, the method 411 may continue with operating the thermal components, such as one or more electronic devices, in a bore hole at block 425.

In some embodiments, the method 411 may include actively cooling one or more of the thermal components using a first heat removing cooling element at block 431. This activity may be assisted by cooling the thermal components with a thermal collector thermally coupled to a cold side of the first heat removing cooling element at block 435.

The method 411 may continue with inducing a thermal gradient in a thermal conduit, such as a heat pipe, perhaps by conducting heat from a hot side of the first heat removing cooling element to a cold side of a second heat removing cooling element using the thermal conduit at block 441. In some embodiments, inducing the thermal gradient in the thermal conduit may further include removing heat from a hot side of the second heat removing cooling element by thermally coupling a second thermal conduit, including a second heat pipe, to the hot side of the second heat removing cooling element at block 445. The method 411 may also include cooling the second heat removing cooling element by thermally coupling a hot side of the second heat removing cooling element to a primary heat sink, such as a thermally conductive element included in the pressure housing (e.g., an interior and/or exterior wall of an insulating flask, and/or a thermal conduit (e.g., heat pipe) in a stopper coupled to the flask), at block 449.

Many variations of the method 411 may be realized. Thus, it should be noted that the methods described herein do not have to be executed in the order described, or in any particular order. Any of the activities described above in conjunction with the methods may be simulated, such that software and hardware modules are combined to provide a simulation environment that mimics the behavior of the apparatus 100, 200, sub-systems 310, and systems 110, 210, and 364 in the real world. Moreover, various activities described with respect to the methods identified herein can be executed in serial, parallel, or iterative fashion.

For the purposes of this document, the terms "information" and "data" may be used interchangeably. Information, including parameters, commands, operands, and other data, including data in various formats (e.g., time division, multiple access) and of various types (e.g., binary, alphanumeric, audio, video), can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well-known to those skilled in the art, such as application program interfaces or inter-process communication techniques, including remote procedure calls. The teachings of various embodiments are not limited to any particular programming language or environment. Thus, other embodiments may be realized, as shown in FIG. 5.

Figure 5:
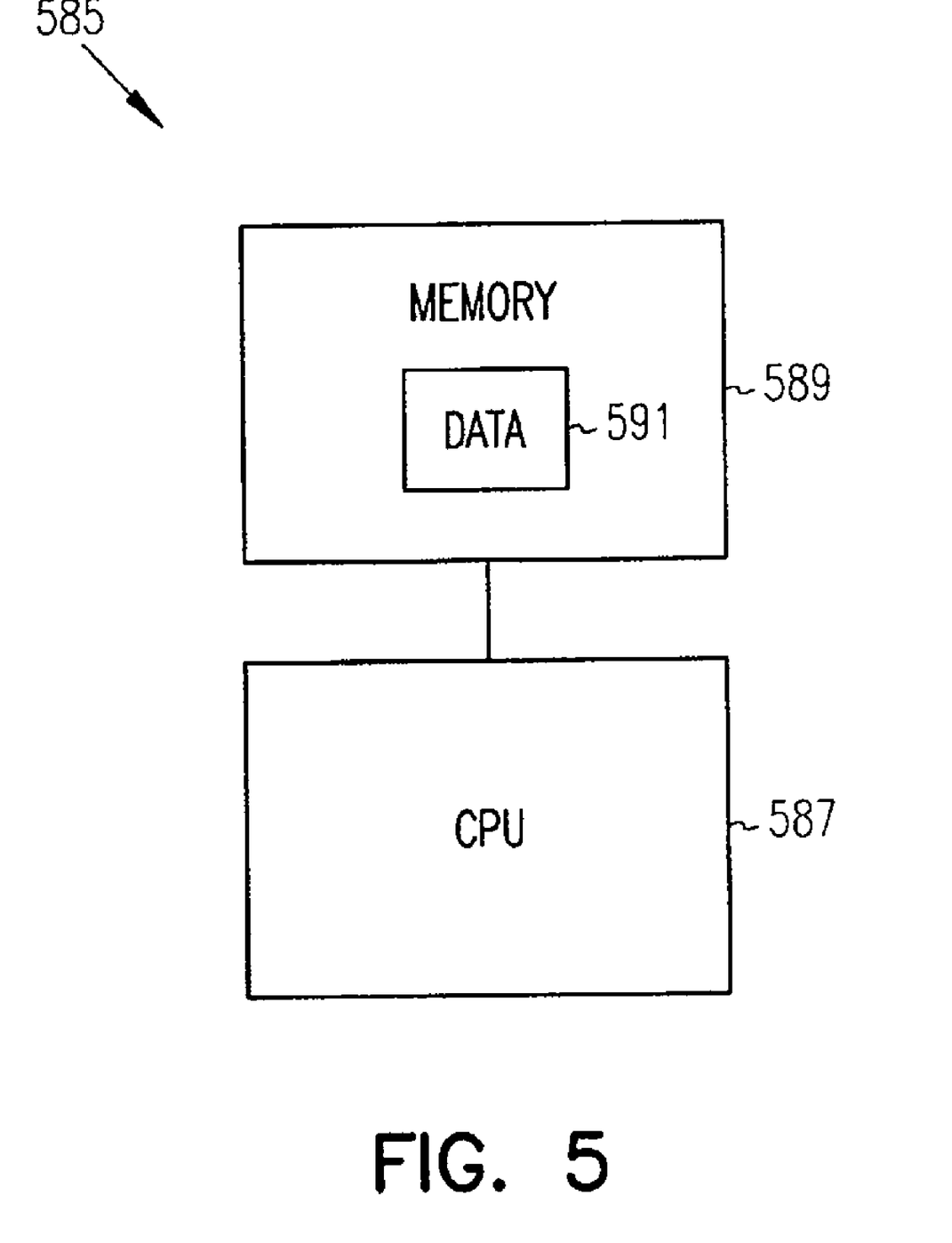
FIG. 5 is a block diagram of an article according to various embodiments of the invention.

FIG. 5 is a block diagram of an article 585 according to various embodiments of the invention, such as a computer, a memory system, a magnetic or optical disk, some other storage device, and/or any type of electronic device or system. The article 585 may comprise a processor 587 coupled to a machine-accessible medium such as a memory 589 (e.g., a memory including an electrical, optical, or electromagnetic conductor) having associated information 591 (e.g., computer program instructions, and/or other data), which when accessed, results in a machine (e.g., the processor 587) performing such actions as (simulating) heat removing cooling of a thermal component using a first heat removing cooling element. Accessing the information may also result in a machine performing the actions of (simulating) induction of a thermal gradient in a thermal conduit by (simulating) conducting heat from a hot side of the first heat removing cooling element to a cold side of a second heat removing cooling element using the thermal conduit, as well as (simulating) removing the heat from a hot side of the second heat removing cooling element coupled to a primary heat sink. The use of the term "simulating" in this paragraph and the following para graph is used to emphasize that the activities described can be conducted under real-world conditions, or merely simulated so as to mimic real-world behavior Further actions may include, for example, (simulating) cooling of the second heat removing cooling element by (simulating) thermally coupling a hot side of the second heat removing cooling element to a primary heat sink, such as a thermally conductive element (e.g., a heat pipe) included in an insulating flask. Other actions may include (simulating) cooling of the electronic device by (simulating) thermal coupling between one or more thermal components and a thermal collector, and between the thermal collector and a cold side of the first heat removing cooling element.

Implementing the apparatus, systems, and methods described herein may provide a mechanism to increase the operational time of electronic devices used in downhole applications. The use of less expensive, more widely available components that tolerate lower operational temperatures may also be enabled.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
   a thermal component;
   a first heat removing cooling element configured to receive operating power, to thermally couple to the thermal component, and disposed to receive heat from the thermal component when the operating power is received;
   a heat pipe connected to and disposed directly adjacent to a hot side of the first heat removing cooling element and disposed to receive heat from the hot side of the first heat removing cooling element when the operating power is received;
   a second heat removing cooling element having a cold side connected to and disposed directly adjacent to a hot side of the heat pipe, the second heat removing cooling element configured to receive operating power to actively induce a thermal gradient in the heat pipe and disposed to receive heat from the hot side of the heat pipe; and
   a primary heat sink connected to and disposed directly adjacent to a hot side of the second heat removing cooling element and disposed to receive heat from the hot side of the second heat removing cooling element when the operating power is received.

2. The apparatus of claim 1, wherein the second heat removing cooling element is selected from one of a thermoelectric cooling device, a thermionic cooling device, a thermal-acoustic cooling device, or a magnetic cooling device.

3. The apparatus of claim 1, wherein the heat pipe comprises a substantially fixed conductance heat pipe having a thermal conductivity of greater than about 50 Btu/(h·ft$^2$·°F.·ft).

4. The apparatus of claim 1, wherein the heat pipe comprises a vaporizable fluid.

5. The apparatus of claim 1, further including:
   a thermal collector disposed between the thermal component and a cold side of the first heat removing cooling element.

6. A system, comprising:
   a thermal component;
   a first heat removing cooling element configured to receive operating power, to thermally couple to the thermal component, and disposed to receive heat from the thermal component when the operating power is received;
   a first heat pipe connected to and disposed directly adjacent to a hot side of the first heat removing cooling element and disposed to receive heat from the hot side of the first heat removing cooling element when the operating power is received;
   a second heat removing cooling element having a cold side connected to and disposed directly adjacent to a hot side of the first heat pipe, the second heat removing cooling element configured to receive operating power to actively induce a thermal gradient in the first heat pipe and disposed to receive heat from the hot side of the first heat pipe; and
   a pressure housing including a primary heat sink to connected to and disposed directly adjacent to a hot side of the second heat removing cooling element and disposed to receive heat from the hot side of the second heat removing cooling element when the operating power is received.

7. The system of claim 6, wherein the pressure housing comprises a substantially evacuated insulating flask.

8. The system of claim 6, wherein the first heat pipe comprises a variable conductance heat pipe.

9. The system of claim 6, wherein the primary heat sink comprises an exterior wall of the pressure housing.

10. The system of claim 6, wherein the primary heat sink comprises a second heat pipe.

11. The system of claim 7, further comprising:
a collar to couple to a drill bit and to house the substantially evacuated insulating flask.

12. The system of claim 7, further comprising:
a tool body to couple to a logging cable and to house the substantially evacuated insulating flask.

13. The system of claim 12, wherein the logging cable includes one of a wireline, a mono-cable, or a slick-line.

14. The system of claim 7, further including:
a stopper mechanically coupled to the substantially evacuated insulating flask, wherein the stopper includes a second heat pipe coupled to a hot side of the second heat removing cooling element.

* * * * *

UNITED STATES PATENT AND TRADEMARK OFFICE
CERTIFICATE OF CORRECTION

PATENT NO. : 8,024,936 B2  Page 1 of 1
APPLICATION NO. : 10/990075
DATED : September 27, 2011
INVENTOR(S) : Bruce H. Storm et al.

It is certified that error appears in the above-identified patent and that said Letters Patent is hereby corrected as shown below:

In column 8, line 54, in Claim 6, after "sink" delete "to".

Signed and Sealed this
Twenty-seventh Day of December, 2011

David J. Kappos
*Director of the United States Patent and Trademark Office*